United States Patent
Terashima et al.

(10) Patent No.: US 7,905,666 B2
(45) Date of Patent: Mar. 15, 2011

(54) OPTICAL MODULE AND METHOD OF MANUFACTURING THE SAME

(75) Inventors: Tokihiro Terashima, Tokyo (JP); Hiroshi Wada, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 626 days.

(21) Appl. No.: 12/068,413

(22) Filed: Feb. 6, 2008

(65) Prior Publication Data

US 2008/0285110 A1 Nov. 20, 2008

(30) Foreign Application Priority Data

Mar. 28, 2007 (JP) .................. 2007-084143

(51) Int. Cl.
G02B 6/36 (2006.01)
G02B 27/30 (2006.01)
G02F 1/00 (2006.01)
H01L 21/00 (2006.01)

(52) U.S. Cl. .................. 385/93; 385/1; 385/2; 385/92; 385/33; 359/245; 359/641; 29/593; 438/31

(58) Field of Classification Search .................. 385/14, 385/31, 33, 34, 52, 88, 89, 1, 2, 3, 92, 93, 385/94, 129, 130, 131; 356/73.1; 438/29, 438/31; 359/245, 641; 29/593

See application file for complete search history.

(56) References Cited

U.S. PATENT DOCUMENTS

| | | | | |
|---|---|---|---|---|
| 5,481,629 A | * | 1/1996 | Tabuchi | 385/14 |
| 5,854,867 A | * | 12/1998 | Lee et al. | 385/49 |
| 6,904,190 B2 | * | 6/2005 | Korenaga et al. | 385/14 |
| 6,937,406 B2 | * | 8/2005 | Matsushima et al. | 359/819 |
| 6,985,647 B2 | * | 1/2006 | Takamori | 385/14 |
| 7,433,550 B2 | * | 10/2008 | Terashima et al. | 385/3 |
| 7,486,846 B2 | * | 2/2009 | Warashina et al. | 385/14 |
| 2005/0129359 A1 | * | 6/2005 | Kwon et al. | 385/33 |
| 2007/0081756 A1 | * | 4/2007 | Terashima et al. | 385/3 |
| 2008/0285110 A1 | * | 11/2008 | Terashima et al. | 359/245 |

FOREIGN PATENT DOCUMENTS

| | | | | |
|---|---|---|---|---|
| JP | H08-201660 A | 8/1996 | | 385/92 X |
| JP | H09-211274 A | 8/1997 | | 385/92 X |
| JP | 2004-093660 A | 3/2004 | | 385/92 X |

* cited by examiner

*Primary Examiner* — Brian M Healy
(74) *Attorney, Agent, or Firm* — Rabin & Berdo, P.C.

(57) ABSTRACT

An optical module includes a first silicon substrate having a first groove at its surface, a second silicon substrate having a second groove at its surface, a Laser device formed on the first silicon substrate, an optical modulator formed on the second silicon substrate, a substrate on which the first and the second silicon substrates are mounted wherein an optical axis of the Laser device is matched up with an optical axis of the optical modulator, a first lens transforming an divergent light emitted from the first optical device into a parallel light, disposed in the first groove, and a second lens converging the parallel light to the second optical device, disposed in the first groove.

16 Claims, 7 Drawing Sheets

OPTICAL MODULE AND METHOD OF MANUFACTURING THE SAME

CROSS-REFERENCE TO RELATED APPLICATION

This application claims the priority benefit of Japanese Patent Application No. 2007-084142, filed Mar. 28, 2007, the entire disclosure of which is incorporated herein by reference.

BACKGROUND OF THE INVENTION

1. Field of the Invention

The invention relates to an optical module having lenses and a optical modulation device mounted on a surface of a silicon substrate, and a method of manufacturing the optical module.

2. Description of the Related Art

Many optical modules having lenses and a optical modulation device mounted on a surface of a silicon substrate are proposed. Some of them are disclosed in the following Japanese Patent Publication References.

JP H08-201660A (hereinafter referred as the Reference 1)
JP H09-211274A (hereinafter referred as the Reference 2)
JP 2004-093660A (hereinafter referred as the Reference 3)

According to the Reference 1, an optical module having a following structure is disclosed. The optical module disclosed in the Reference 1 includes a first V-letter shaped groove and a second V-letter shaped groove perpendicular to the first groove, both of which are formed in a silicon substrate. One end of an optical fiber is fixed at the first groove, and a light emitting device is mounted along the optical axis of the optical fiber with the relatively soft accuracy. A ball lens is placed in the second groove. In order to adjust the optical relationship among the light emitting device, the ball lens and the optical fiber, the ball lens is moved along the second groove while the light emitting device is in operation. The light beam emitted from the light emitting device is converged by the ball lens, and is entered into the optical fiber. As a result, by measuring the coupling condition among the light emitting device, the ball lens and the optical fiber, the optical relationship among them is adjusted in the most appropriate condition.

In the field of the long distance optical communication, it is required to use a transmitter, which has small wavelength chirp, as a lighting source, because the wavelength dispersion characteristics, which are inherent in the optical fiber as the transmission medium, deteriorates the communication quality in which a little fluctuation of the communication wavelength makes large distortion to the transmittal waveform. Even if a Distributed Feed-Back type Laser device (hereinafter called a DFB Laser device) is used as a lighting source, an external modulator system such as an Electro-Absorption (EA) semiconductor modulator or a Mach-Zehnder type modulator using Lithium Niobe Oxide (LiNbO3) or Indium Phosphide (InP) compound semiconductor is generally used because an oscillation wavelength of the DFB Laser device is easily fluctuated in a direct modulation system in which the injected current is directly transformed.

Under the external modulator system, because the modulation control of the input/output of light is performed by the external devices, the injected current of the DFB Laser device can be used as the constant optical output without transforming injected current. Thus, a single waveform oscillation having small wavelength chirp can be fulfilled. In recent years, a device in which a DFB Laser device and an EA modulator element are monolithically-integrated is frequently used so that an assembling cost or an area to be assembled can be reduced.

On the other hand, in a dense wavelength division multiplexing (DWDM) transmitting system, which is superior for the expandability of the communication capacity, it is necessary to suppress the cross-talk between the light signals, each of which is adjacent to each other with an extremely narrow wavelength interval, due to the trend of the multiple wavelength by segmentalizing the band wavelength. For this reason, the stabilization of each signal wavelength becomes one of the most important issues to be resolved. However, when the number of the communication wavelength is increased because of the segmentation of the optical wavelength, it is required to prepare the devices of the particular number, which is the same as the number of the wavelength sued in the system, on the basis that a band-gap wavelength of an absorber layer in the EA modulator element is designed to match up with each communication wavelength and is provided in the modulator in which the EA modulator element is used. As a result, increasing the cost for the development, the manufacture and the management of the stocks is unavoidable. Thus, it is considered that there is a limit to apply the EA modulator element in the DWDM transmitting system. Furthermore, while the oscillation wavelength of the DFB Laser device is changed in the rate of 1 Å/° C., the bang-gap wavelength of the EA modulator element is changed in the rate of 4~5 Å/° C. Thus, in order to avoid shifting a wavelength-detuning, which means that the band-gap wavelength of the absorber layer in the EA modulator element matches up with the oscillation wavelength of the DFB Laser device, it is required to control the temperature of each of the DFB Laser device and the EA modulator element, rigorously. To resolve this problem, a modulator using a Mach-Zehnder type modulator element starts to garner attention.

Since the Mach-Zehnder type modulator element has small wavelength chirp, and it can covers a wide range of wavelength domain as a single device, it is suitable for the long distance and multiple-wavelength transmission system. By the monolithic or the hybrid integration of the DFB Laser device with the Mach-Zehnder type modulator element, it is possible to reduce the number of the device group being prepared for the number of the wavelength used in the system. As a result, it is possible to reduce the cost for the development, the manufacture and the management of the stocks.

Figure 6:
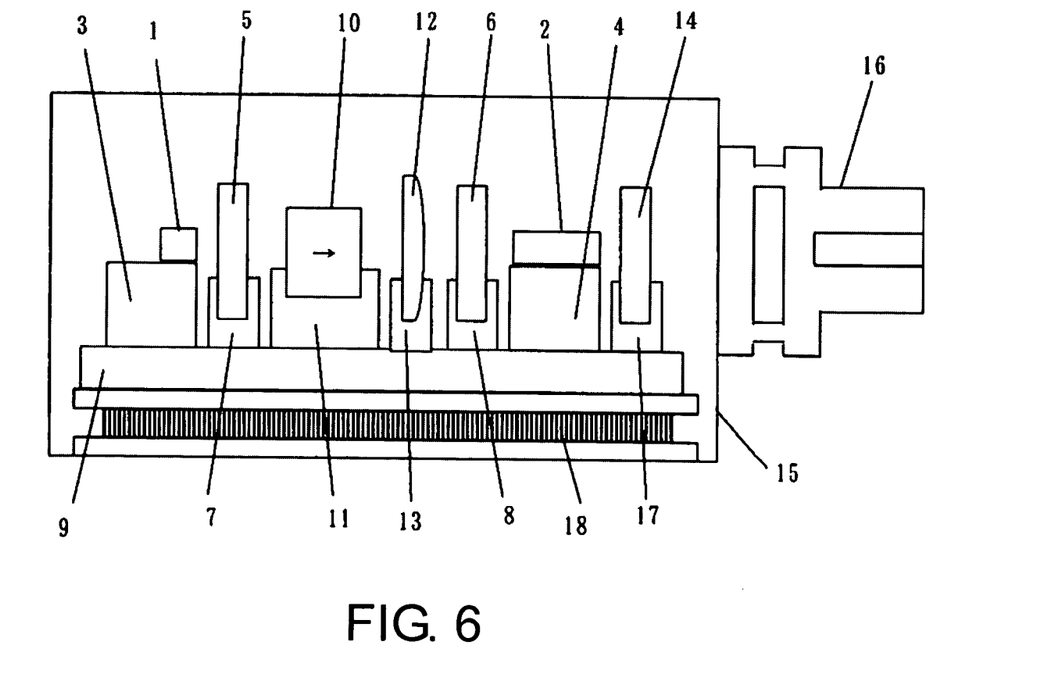
FIG. 6 is a side view showing a frame format of the conventional optical module.

The hybrid integration structure of the DFB Laser device with the Mach-Zehnder type modulator element serve as a typical example used in the long distance and multiple-wavelength transmission system is explained as follows with reference to FIG. 6. FIG. 6 is a side view showing a frame format of the conventional optical module disclosed in the Reference 2.

The optical module shown in FIG. 6 is a device hybridly integrating a DFB Laser device 1 with a Mach-Zehnder type modulator element 2. The DFB Laser device 1 mounted on a first carrier 3 and the Mach-Zehnder type modulator element 2 mounted on a second carrier 4 are optically coupled to each other by a first lens 5 having a holder and a second lens 6 having a holder. The first lens 5 and the second lens 6 are centered along their cores in the three axis directions on a first lens core adjuster 7 and a second lens core adjuster 8, respectively, and then, these adjusters 7 and 8 are fixed by the YAG Laser weld on a stainless base carrier 9.

Further, a tube-shaped isolator 10, which passes light in one direction, is disposed between the first and the second lenses, and is fixed on supporting member 11 by the YAG Laser weld. Moreover, a compensation lens 12 having a holder, which optically adjusts the slight dislocation of the centering for the cores of the lenses 7 and 8, is disposed between the lenses 7 and 8. The compensation lens 12 is fixed by the YAG Laser weld on the stainless base carrier 9 via a compensation lens adjuster 13 after the adjustment of the dislocation of the centering for the cores of the lenses 7 and 8. As described in the Reference 2, when the compensation lens 12 having a large curvature radius is used, it is possible to perform the fine adjustment of the angle of the focused laser beam with a rough centering process. Thus, by suing the compensation lens 12 having a large curvature radius, the adjustment of the slight dislocation can be easily fixed.

After a third lens 14 having a holder is centered along its cores with the cores of the first and the second lenses 7 and 8 in the three axis directions in order to couple an optical signal outputted from the Mach-Zehnder type modulator element 2 with an optical fiber 16 having a built-in lens, which is disposed outside a package 15, it is fixed by the YAG Laser weld on the stainless base carrier 9 via a third lens adjuster 17. The stainless base carrier 9 is fixed by solder on a thermal electro cooler 18 disposed in the package 15

The DFB Laser device 1 outputting a uniform light is thermally controlled by thermal electro cooler 18 in order to oscillate a single waveform constantly. The Mach-Zehnder type modulator element 2 is electrically controlled by a high-speed modulation signal outputted from a driver IC, and is functioned as a shutter either for passing through or blocking the laser light from the DFB Laser device 1.

However, the optical module shown in FIG. 6 has following issues. First, since a spot size of the light in each of the DFB Laser device 1 and the Mach-Zehnder type modulator element 2 is very small such as around 1 μm and since a tolerance of the dislocating of the centering for the cores of them is very strict, the accuracy required for centering the cores of lenses should be within an accuracy of sub-micrometers. In fact, because of the use of the compensation lens 12, the accuracy is eased to an accuracy of micrometers. However, since the range of the adjustment by the compensation lens 12 is not so wide, the DFB Laser device 1, the first lens 5, the second lens, and the Mach-Zehnder type modulator element 2 should be disposed to an accuracy of micrometers in order to obtain the fine optical coupling efficiency.

It is not easy for the hybrid structure having a plurality of components illustrated in FIG. 6 to dispose the components at the locations to an accuracy of micrometers. For this reason, new assemble process utilizing an image or a marker-recognition is introduced, or the strict management as to the size of each component to be mounted is required. As a result, the cost for the accurate process or the inspection of the components or the cost for accurate mounting the components increases.

The second issue relates to the method of fixing the lenses. As described above, the first lens 5 and the second lens 6 are fixed by the YAG Laser weld on a stainless base carrier 9 via each of the adjusters 7 and 8 after they are centered along their cores in the three axis directions. Because of the inherency of the YAG Laser weld, the melted metal is condensed at the time of the natural cooling so that it is not easy to place the lenses at the location to an accuracy of micrometers. Thus, the dislocation of the centering for the cores of the lenses 7 and 8 caused at the time of the YAG Laser weld is adjusted by the compensation lens 12. However, since the compensation lens 12 having the large curvature radius is lens-shaped, while it has ability for fine adjustment of the angle of the focused laser beam with a rough centering process, it has little ability for focusing the light. Thus, the compensation lens 12 cannot adjust the dislocation in the optical axis direction. For this reason, it is still required to dispose the lenses in the optical axis direction to an accuracy of sub-micrometers.

In order to avid these issues, an optical module disposed in the Reference 3 is proposed. According to the optical module disclosed in the Reference 3, a V-letter shaped groove is formed at a surface of a silicon substrate, and a spot shape changeable element, a first and a second lens elements, an EA modulator, a Laser diode, and optical fiber are mounted along the V-letter shaped groove. The Laser diode and the EA modulator are optically coupled by the first lens element, and the EA modulator and the optical fiber are optically coupled by the spot shape changeable element and the second lens element. The EA modulator includes a waveguide structure and it has a rectangularily-shaped core at its cross-sectional view. The spot of the light outputted from the core is elliptically-shaped.

The divergent light having the elliptically-shaped spot outputted from the Laser diode is focused by the first lens element and the focused divergent light still having the elliptically-shaped spot is injected into the core of the EA modulator. The divergent light having the elliptically-shaped spot outputted from the core is changed to the parallel light having the circularly-shape spot, and then the parallel light having the circularly-shape spot is transformed into the convergent light by the second lens element. Finally the convergent light is injected into the optical fiber.

According to the optical module disclosed in the Reference 3, since the spot shape changeable element and the lens elements are disposed between the EA modulator and the optical fiber, the parallel light having the circularly-shape spot, which is changed from the divergent light having the elliptically-shaped spot outputted from the core of the EA modulator, can be injected into the optical fiber. As a result, the coupling efficiency can be dramatically improved. Further, since the spot shape changeable element includes an adjustment member whose shape is suitable for the silicon substrate, no holder is required for the lenses and the lenses are easily mounted in the V-letter shaped groove in a short amount of time. Thus, the cost can be reduced. Moreover, the lenses disclosed in the References 1 and 2 are used, it is required to have a wiring distance sufficient to apply the bias voltage to the EA modulator. However, according the optical module disclosed in the Reference 3, the wiring distance can be the same as that in the case that the spot shape changeable element and the lens elements are not used. Thus, the deterioration of the modulation characteristic can be avoided. As a result, the optical components can be effectively coupled to each other.

However, the optical module disclosed in the Reference 3 has another issue as follows. Generally, after mounting the EA modulator and the Laser diode on the silicon substrate, burn-in tests are performed to detect an incipient failure on the EA modulator or the Laser diode in advance. Since the EA modulator and the Laser diode are mounted on the single silicon substrate, the device that both of the first burn-in test for the relationship between the Laser diode and its wire and the second burn-in test for the relationship between the EA modulator and its wire are passed can only be judged as the non-defective products so that the yield rate is deteriorated.

SUMMARY OF THE INVENTION

An objective of the invention is to solve the above-described problem and to provide an optical module whose yield rate is increased, whose reliability is high, whose manufacturing process is simple, whose cost is cheap and whose size is small.

The objective is achieved by an optical module including a first silicon substrate having a first groove at its surface, a second silicon substrate having a second groove at its surface, a Laser device mounted on the first silicon substrate, an optical modulator mounted on the second silicon substrate, a substrate on which the first and the second silicon substrates are mounted wherein an optical axis of the Laser device is matched up with an optical axis of the optical modulator, a first lens transforming an divergent light emitted from the first optical device into a parallel light, disposed in the first groove, and a second lens converging the parallel light to the second optical device, disposed in the first groove.

BRIEF DESCRIPTION OF THE DRAWINGS

The invention will be more particularly described with reference to the accompanying drawings, in which:

FIGS. 2A~2I are sequential cross-sectional views taken along line X-X' of FIG. 1A for manufacturing the optical module illustrated in FIG. 1B, and Specifically.

DETAILED DESCRIPTION OF THE PREFERRED EMBODIMENTS

The first through fourth embodiments of the invention is explained together with drawings as follows. In each drawing, the same reference numbers designate the same or similar components through all embodiments.

The First Embodiment

[Structure of an Optical Module]

Figure 1A:
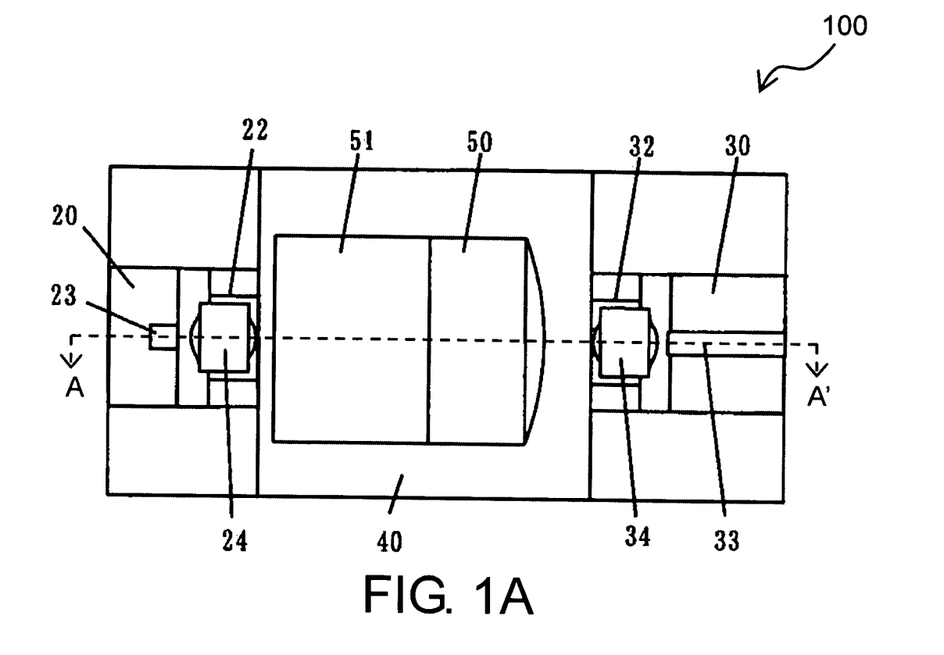
FIG. 1A is a plan view of an optical module, according to a first embodiment.
Figure 1B:
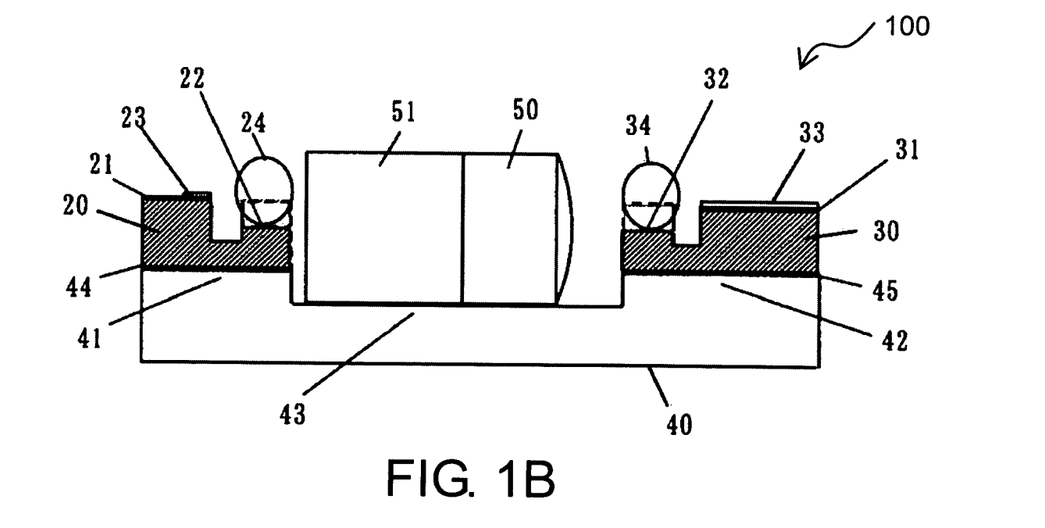
FIG. 1B is a cross-sectional view of the optical module illustrated in FIG. 1, taken along with line A-A'.

FIG. 1A is a plan view of an optical module, according to a first embodiment, and FIG. 1B is a cross-sectional view of the optical module illustrated in FIG. 1, taken along with line A-A'.

An optical module 100 includes a first silicon substrate 20 on which an optical semiconductor device 23 is mounted, a second silicon substrate 30 on which another optical semiconductor 33 device is mounted, which faces to the first silicon substrate 20, and a substrate 40, such as a stainless base carrier (hereinafter called a SUS base carrier 40), for fixing the first silicon substrate 20 and the second silicon substrate 30 thereon, which are spaced to each other, and are disposed along the same optical axis.

A first wiring 21, which is a conductive pattern, is formed on the surface of the first silicon substrate 20 at one end side, and a first groove 22 being nearly V-letter shape at its cross sectional view (hereinafter it is called a first V-letter shaped groove) is formed on the surface of the first silicon substrate 20 at the other end side. The first V-letter shaped groove 22 is formed for matching up the optical axis emitted from the optical device of its own with the optical axis emitted from the optical device mounted on the second silicon substrate 30. On the surface of the first silicon substrate 20, the optical semiconductor device 23, such as a Laser device, like a semiconductor Laser or a Laser diode (hereinafter called a Laser device 23), are mounted, and the optical semiconductor device 23 is electrically connected to the first wiring 21. A first lens 24 for transforming the divergent light from the Laser device 23 to the parallel light is placed in the first V-letter shaped groove 22. The first lens 24 is formed by a compact collimated lens or a ball lens.

The Laser device 23 is mounted with a high degree of accuracy at the predetermined location on the first silicon substrate 20 by using an image-recognition technique or a mechanical positioning control system. On the first silicon substrate 20, a surface-mounted type front drive lens coupler is formed by disposing the first lens 24 in the first groove 22 by using the image-recognition technique or the mechanical positioning control system in order to set a distance between a luminous surface of the Laser device 23 and the surface of the first lens 24 to an appropriate coupling length. Since the V-letter shaped groove 22 is formed at the surface of the first silicon substrate 20 with a high degree of accuracy by the wet etching process, such as the alkali etching, by placing the first lens in the first V-letter shaped groove, it is possible to make the accurate mechanical positioning of it with the Laser device 23, which is also mounted with a high degree of accuracy.

A second wiring 31, which is a conductive pattern, is formed on the surface of the second silicon substrate 30 at the other end side, and a second groove 32 being nearly V-letter shape at its cross sectional view (hereinafter it is called a second V-letter shaped groove) is formed on the surface of the second silicon substrate 30 at the other end side. The second V-letter shaped groove 32 is formed for matching up the optical axis emitted from the optical device of its own with the optical axis emitted from the optical device mounted on the first silicon substrate 30. On the surface of the second silicon substrate 30, the optical semiconductor device 33, such as an optical modulator (hereinafter called an optical modulator 33), which modulates the beam outputted from the Laser device 23 in response to an external signal, are mounted, and the optical modulator 33 is electrically connected to the second wiring 31. A second lens 34 for condensing the parallel light outputted from the first lens 24 at the optical modulator 33 is placed in the second V-letter shaped groove 32. The second lens 34 is formed by a compact condenser lens or a ball lens.

The optical modulator 33 is formed by a Mach-Zehnder type optical modulator. Compared with the Laser device 23, the Mach-Zehnder type optical modulator has less refractive index dispersion (wavelength dispersion). The optical modulator 33 is mounted with a high degree of accuracy at the predetermined location on the second silicon substrate 30 by using the image-recognition technique or the mechanical positioning control system. In order to set a distance between a light receiving surface of the optical modulator 33 and the surface of the second lens 34 to an appropriate coupling length, the optical adjustment process is performed by sliding the second lens 34 along the V-letter shaped groove 32. As to the adjustment of the direction vertical to the optical axis, it is performed by placing the second lens 34 mechanically in the V-letter shaped groove 32. By the mounting these components on the second silicon substrate 30, a surface-mounted type rear drive lens coupler is formed on the second silicon substrate 30.

The SUS base carrier 40 includes a first mounting area 41 on its surface at one end on which the first silicon substrate 20 is to be mounted, a second mounting area 42 on its surface at the other end on which the second silicon substrate 30 is to be mounted, and a cavity area 43 located between the first and the second mounting areas. The first silicon substrate 20 is fixed on the substrate 40 in the first mounting area 41 by jointing material 44, such as glue or solder, and the second silicon substrate 30 is also fixed on the substrate 40 in the second mounting area 42 by jointing material 45, such as glue or solder. A compensation lens 50 for optically adjusting the optical dislocation of the first and the second lenses 24 and 34 is fixed by resin adhesive material on the bottom surface of the cavity area 43 in an area, which is closer to the second mounting area 42. An isolator 51, such as a compact isolator, for passing through the parallel light outputted from the first lens 24 in one direction and applying it to the compensation lens 50, is fixed by resin adhesive material on the bottom surface of the cavity area 43 in another area, which is closer to the first mounting area 41, that is located between the first lens 24 and the compensation lens 50. The variation in thickness of the first and the second silicon substrates 20 and 30 in their manufacturing process, which is in the range between 10 μm and 25 μm, is equivalent to the thickness fluctuation of a silicon wafer. Since such a variation in thickness is small, the dislocation in height comparative to the optical effective range of the isolator 51 so that the isolator 51 is easily positioned mechanically to the predetermined location. Further, since the second lens 34 is fixed in the second V-letter shaped groove 32 by the resin after centering the optical axis thereof, the dislocation of the second lens at the time of the mounting it is hardly occurred, compared with fixing the second lens by the YAG Laser weld. Thus, it is possible to fix the second lens 34 at the desired location with a high degree of accuracy without performing the adjustment in the optical axis direction. On the other hand, the optical adjustment of the compensation lens 51 is performed in the direction only which is perpendicular to the optical axis direction. Thus, numbers of components used for the adjustment, such as lens holder, can be reduced. Further, by fixing the compensation lens 51 at the end of the isolator 51 with resin, the cost and space can be reduced.

[Method of Manufacturing]

The optical module shown in FIGS. 1A and 1B is manufactured in the following steps (a)~(j). The manufacturing process of the optical module is explained with reference to FIGS. 2A~2I.

(a): First Step

Figure 2A:
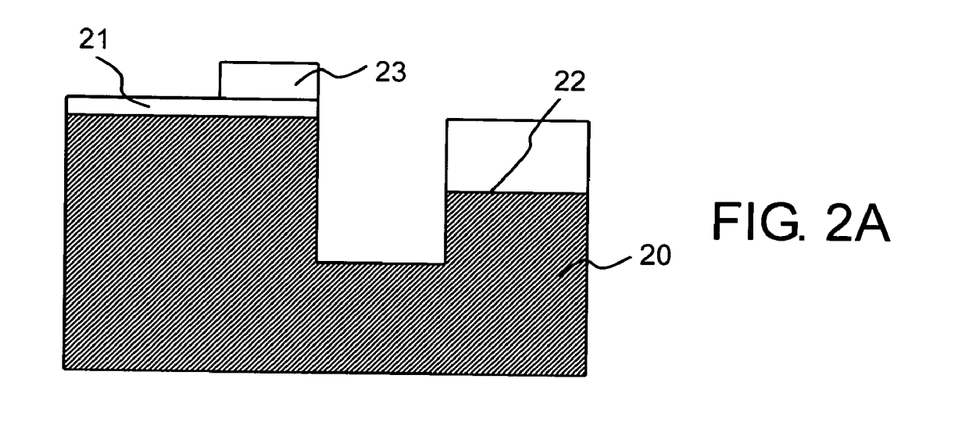

As shown in FIG. 2A, initially, the first silicon substrate 20 is prepared. Then, the first V-letter shaped groove 22 is formed on the surface of the first silicon substrate 20 by a wet etching process, such as the alkali etching. Then, the first wiring 21 formed of a copper foil wiring pattern is formed by the photolithography. The Laser device 23 is positioned and mounted on the first silicon substrate 20. As described above, the Laser device 23 is mounted with a high degree of accuracy at the predetermined location on the first silicon substrate 20 by using the image-recognition technique or the mechanical positioning control system.

(b): Second Step

Figure 2B:
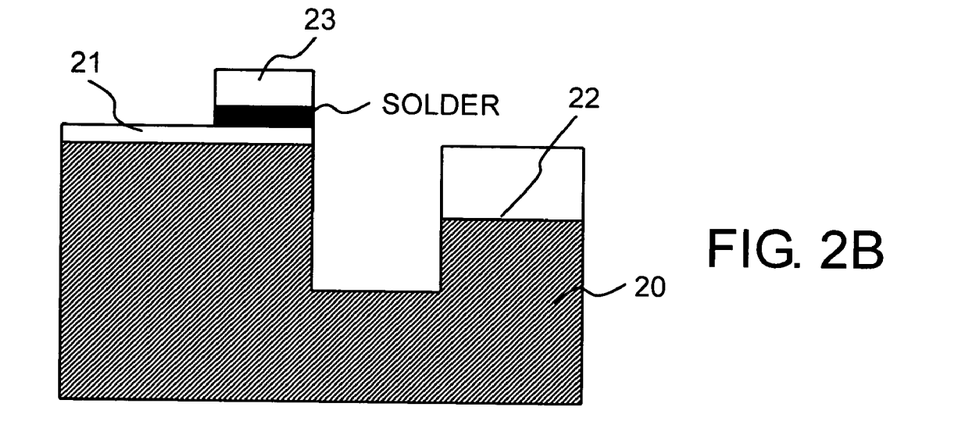

As shown in FIG. 2B, the Laser device 23 is electrically connected to the first wiring 21 by solder.

(c): Third Step

Figure 2C:
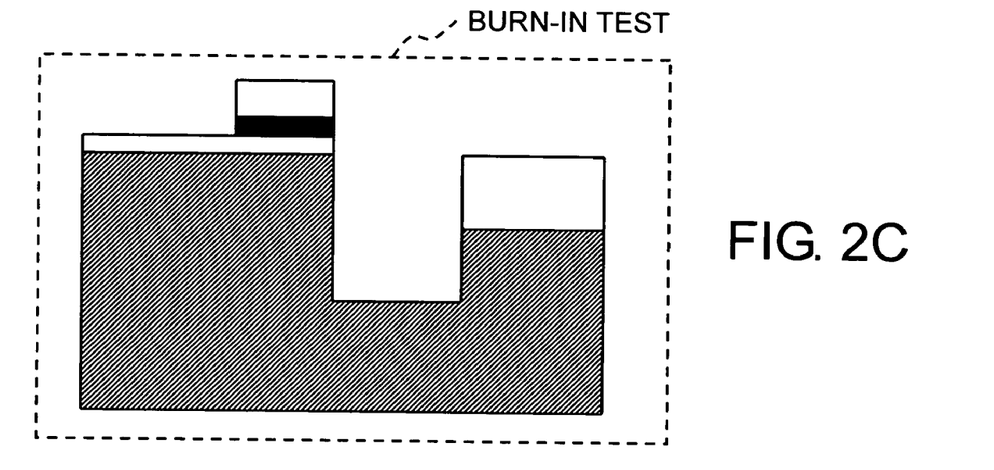

As shown in FIG. 2C, a first burn-in test for the relationship between the Laser diode 23 and the first wire 21 is performed by using a tester. If necessary, the operation of the Laser diode 23 may be tested by applying the predetermined voltage to the Laser diode 23.

(d): Fourth Step

Figure 2D:
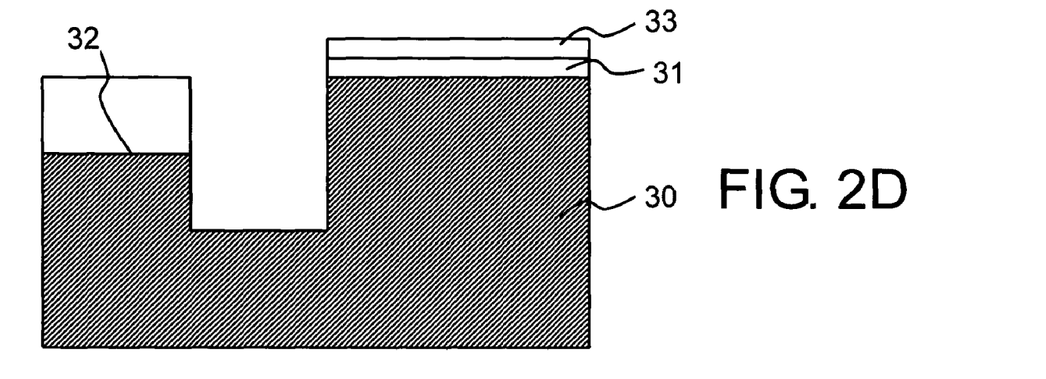

As shown in FIG. 2D, initially, the second silicon substrate 30 is prepared. Then, the second V-letter shaped groove 32 is formed on the surface of the second silicon substrate 30 by a wet etching process, such as the alkali etching. Then, the second wiring 31 formed of a copper foil wiring pattern is formed by the photolithography. The optical modulator 33 is positioned and mounted on the second silicon substrate 30. As described above, the optical modulator 33 is mounted with a high degree of accuracy at the predetermined location on the second silicon substrate 30 by using the image-recognition technique or the mechanical positioning control system.

(e): Fifth Step

Figure 2E:
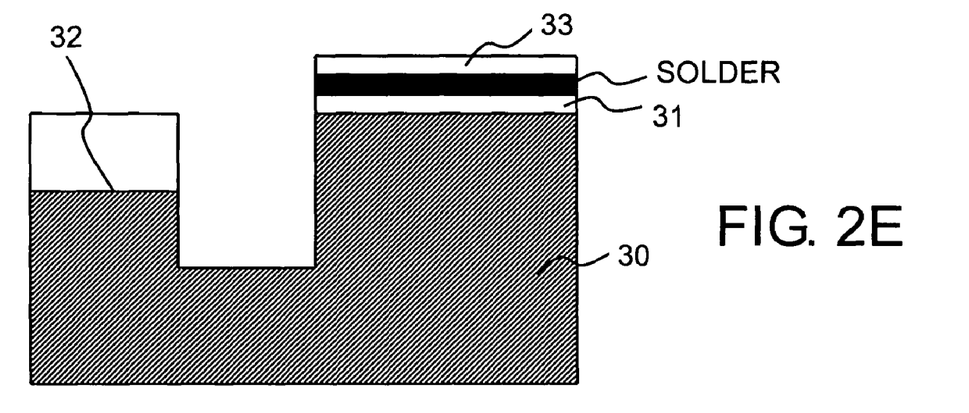

As shown in FIG. 2E, the optical modulator 33 is electrically connected to the second wiring 31 by solder.

(f): Sixth Step

Figure 2F:
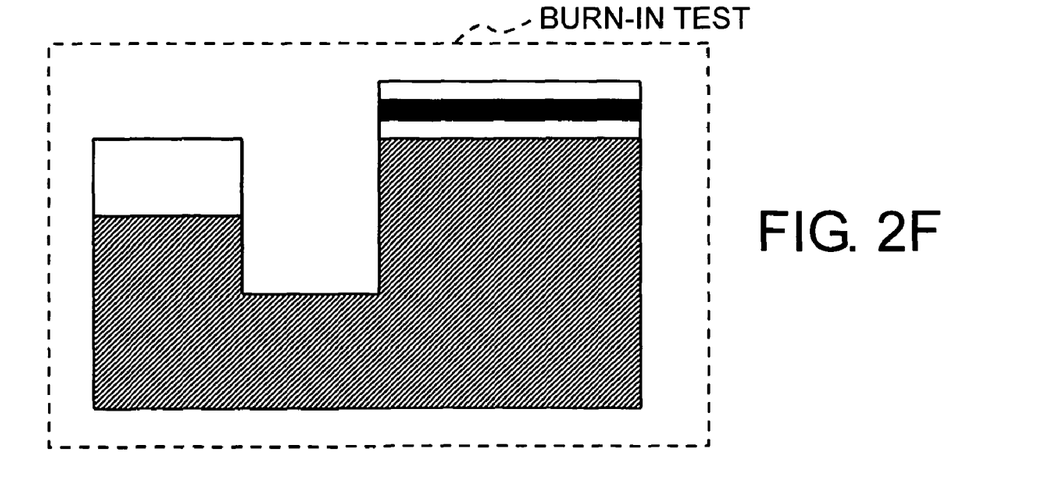

As shown in FIG. 2F, a second burn-in test for the relationship between the optical modulator 33 and the second wire 31 is performed by using the tester. If necessary, the operation of the optical modulator 33 may be tested by inputting the predetermined signal or light to the optical modulator 33.

(g): Seventh Step

The first and the second silicon substrates 20 and 30 are aligned along the centers of each the first and the second V-letter shaped grooves 22 and 32. The method of aligning the first and the second silicon substrates 20 and 30 is explained as follows with reference to FIG. 2G.

Figure 2G:
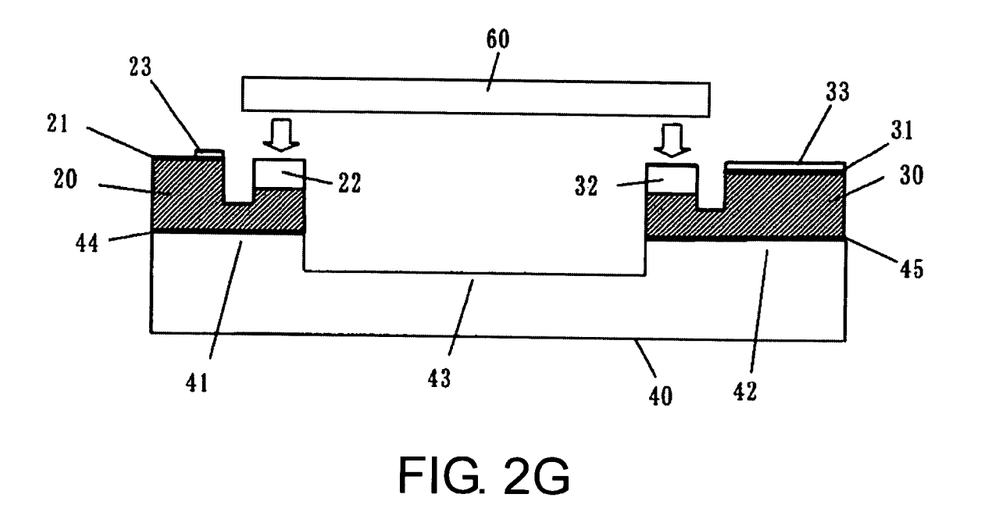
FIG. 2G is a conceptual cross-sectional view of the optical module illustrated in FIG. 1B in-process for explaining a method of aligning a center of the V-letter shaped groove formed in a first silicon substrate with a center of the V-letter shaped groove formed in a second silicon substrate.

FIG. 2G is a conceptual cross-sectional view of the optical module 100 illustrated in FIG. 1B in-process for explaining the method of aligning a center of the V-letter shaped groove 22 formed in a first silicon substrate 20 with a center of the V-letter shaped groove 32 formed in a second silicon substrate 30. After performing the third step and the sixth step, the first and the second silicon substrates 20 and 30 are mounted on the SUS base carrier 40 by aligning the optical axis of the first silicon substrate 20 with the optical axis of the second silicon substrate 30 in the following process.

First, the first silicon substrate 20 on which the Laser device 23 is mounted and the second silicon substrate 30 on which the optical modulator 33 is mounted are mounted at the predetermined approximate locations on the first mounting area 41 and on the second mounting area 42. Then, a guide member 60, which is linear-shaped, such as a circular cylinder, as shown in FIG. 2, is placed in the first and the second V-letter shaped grooves 22 and 32, and the guide member 60 is pressed from above. Specifically, the guide member 60 is pressed at two areas where the first and the second V-letter shaped grooves 22 and 32 are located underneath, simultaneously. The centers of the first and the second V-letter shaped grooves 22 and 32 are aligned linearly along the guide member 60 so that the Laser device 23 and the optical modulator 33 are aligned in the correct relative position, accurately.

Since the optical axis of the Laser device 23 can be easily positioned mechanically with the optical axis of the optical modulator 33 by simply using the first and the second V-letter shaped grooves 2, the optical coupling adjustment, which was a demanding task in the past, can be made easily. Then, while the first silicon substrate 20 and the second silicon substrate 30 are pressed by the guide member 60, the first silicon substrate 20 and the second silicon substrate 30 are fixed by solder or resin 44, 45 on the first and second mounting areas, respectively, so that each component used for the lens adjustment is aligned in the correct relative position.

(h): Eighth Step

Figure 2H:
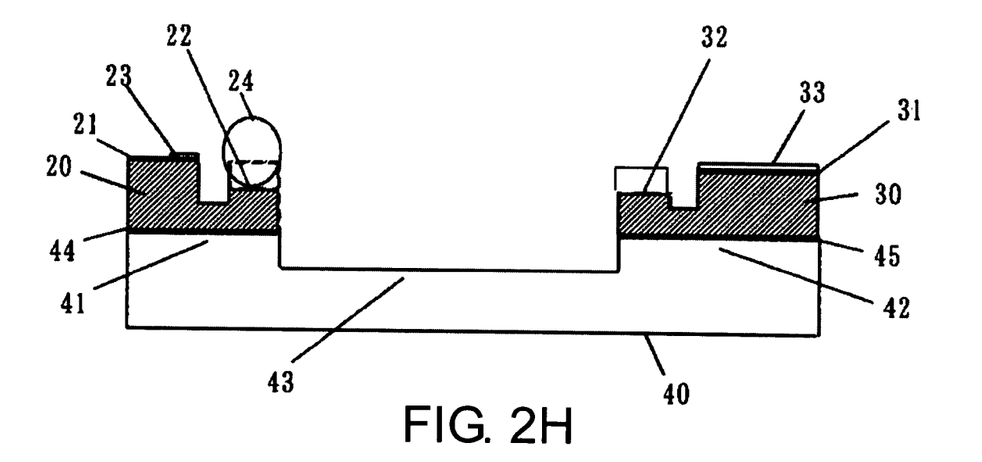

As shown in FIG. 2H, after performing the seventh Step, the first lens 24 is placed and positioned in the first V-letter shaped groove 22 by using the image-recognition technique or the mechanical positioning control system in order to set a distance between a luminous surface of the Laser device 23 and the surface of the first lens 24 to an appropriate coupling length, and then is fixed in the first V-letter shaped groove 22 by resin. As described above, since the first V-letter shaped groove 22 is formed with a high degree of accuracy because of its manufacturing process using the wet etching, it is possible to align mechanically the first lens 24 positioned in the first V-letter shaped groove 22 with the Laser device 23, which is disposed with a high degree of accuracy.

(i): Ninth Step

Figure 2I:
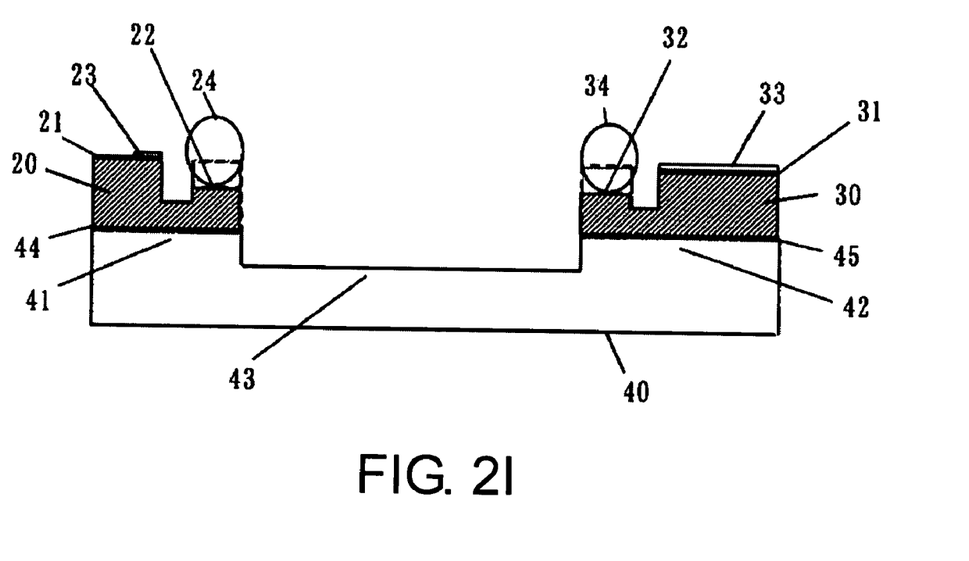

As shown in FIG. 2I, after performing the seventh Step, the second lens 34 is placed in the second V-letter shaped groove 32. In order to set a distance between a light receiving surface of the optical modulator 33 and the surface of the second lens 34 to an appropriate coupling length, the optical adjustment process is performed by sliding the second lens 34 along the V-letter shaped groove 32. As to the adjustment of the direction vertical to the optical axis, it is performed by placing the second lens 34 mechanically in the V-letter shaped groove 32, and finally, the second lens 34 is fixed in the V-letter shaped groove 32 by resin.

(j): Tenth Step

As shown in FIG. 1B, after performing the ninth step, the compensation lens 50 for optically adjusting the optical dislocation of the first and the second lenses 24 and 34 is disposed between the first and the second lenses 24 and 34 on the bottom surface of the cavity area 43 in an area, which is closer to the second mounting area 42, and the compensation lens 50 may be fixed by resin.

The isolator 51, such as a compact isolator, for passing through the parallel light outputted from the first lens 24 in one direction and applying it to the compensation lens 50, is disposed between the first lens 24 and the compensation lens 50 on the bottom surface of the cavity area 43 in another area, which is closer to the first mounting area 41, and the isolator may be fixed by resin.

The variation in thickness of the first and the second silicon substrates 20 and 30 in their manufacturing process, which is in the range between 10 and 25 µm, is equivalent to the thickness fluctuation of a silicon wafer. Since such a variation in thickness is small, the dislocation in height comparative to the optical effective range of the isolator 51 so that the isolator 51 is easily positioned mechanically to the predetermined location. On the other hand, the optical adjustment of the compensation lens 51 is performed in the direction only which is perpendicular to the optical axis direction.

[Effects/Benefits]

According to the optical module of the first embodiment, the following benefits (1)~(3) can be expected.

(1): While the Laser device 23 is mounted on the first silicon substrate 20, the optical modulator 33 is mounted on the second substrate 30, which is different from the first silicon substrate 20. And then, the first and the second silicon substrates 20 and 30 are mounted in the first and the second mounting areas 41 and 42, respectively, so that the optical axis of the Laser device 23 is matched up with the optical axis of the optical modulator 33. According to the structure described above, since the Laser device 23 and the optical modulator 33 are mounted on the different silicon substrates, such as the first silicon substrate 20 and the second silicon substrate 30, respectively, the burn-in test can be performed to the Laser device 23 and the optical modulator 33, separately. Thus, when one of the first silicon substrates 20 each having the Laser device 23 to be tested passes the first burn-in test, and one of the second silicon substrates 30 each having the optical modulator 33 to be tested does not pass the second burn-in test, the first silicon substrate 20 having the passing Laser device 23 can be mounted on the SUS base carrier 40. As described in the BACKGROUND OF THE INVENTION, according to the conventional optical module, since the Laser device and the optical modulator are mounted on the single silicon substrate, even if one of the Laser device and the optical modulator is judged as a non-defective, both of the Laser device and the optical modulator is judged as a defective product because they are mounted on the single silicon substrate. However, according to the optical module of the first embodiment, since the Laser device 23 and the optical modulator 33 are mounted on the different silicon substrates, the burn-in test can be performed separately. Thus, the yield rate is improved.

(2): Generally, since a Laser device 23 has a wide range of the refractive index dispersion, it is required to prepare many kinds of Laser devices 23 such as for 1.3 µm range or for 1.5 µm range in response to the wavelength to be outputted. On the other hand, since an optical modulator has a narrow range of the refractive index dispersion, the optical modulator 33 can be combined with the Laser device 23 having a wavelength, which is different from the wavelength of the optical modulator 33. Thus, one of the characteristics of the optical module of the first invention is that the optical components having a different general versatility are mounted on the different silicon substrates.

(3): Since the surface-mounted type lens coupling structure with the use of the silicon substrate is employed in the first embodiment, it is possible to reduce the process for mounting the component, which requires the optical adjustment. The process effectiveness can be improved. Further, the cost can be reduced by reducing the numbers of the components, and the total size can be shrunken by mounting the components within a limited space. As a result, it is possible to provide an optical module whose reliability is high, whose manufacturing process is simple, whose cost is cheap and whose size is small.

The Second Embodiment

Figure 3:
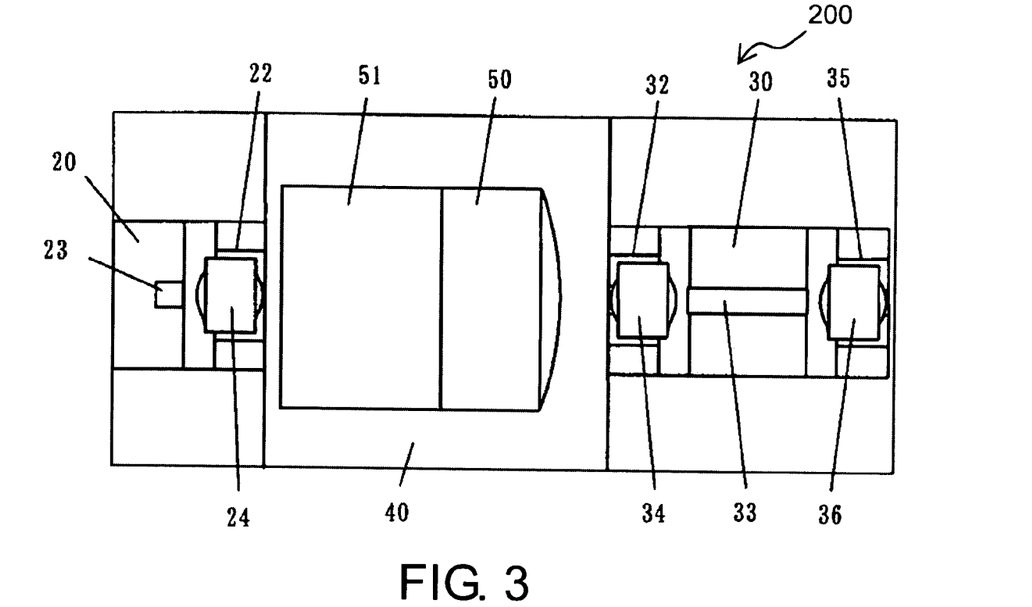
FIG. 3 is a plan view of an optical module, according to a second embodiment.

FIG. 3 is a plan view of an optical module 200, according to a second embodiment. A second silicon substrate 30 includes a second V-letters shaped groove 32 on its surface at one end and a third groove 35 being nearly V-letter shape at its cross sectional view (hereinafter it is called a third V-letter shaped groove) on its surface at the other end. Thus, an optical modulator 33 is disposed between the second and the third V-letter shaped grooves 32 and 35. A third lens 36 is disposed in the third V-letter shaped groove 35. The second lens 34, the optical modulator 33 and the third lens 36 are disposed along the same optical axis. The third lens 36 is formed by a compact collimated lens or a ball lens. The other components used in the optical module 200 of the second embodiment are the same as those used in the optical module 100 of the first embodiment.

The second and the third V-letter shaped grooves 32 and 35 are formed simultaneously, and as well as the other lenses, the third lens 36 is fixed by resin in the third V-letter shaped groove 35. The method of manufacturing the other components used in the optical module 200 of the second embodiment is the same as that of the first embodiment.

According to the optical module 200 of the second embodiment, by placing and positioning the third lens 36 in the first V-letter shaped groove 22 by using the image-recognition technique or the mechanical positioning control system in order to set a distance between a luminous surface of the optical modulator 33 and the surface of the third lens 36 to an appropriate coupling length, the third lens 36 can be mounted with a high degree of accuracy without performing the optical adjustment to the optical modulator 33 so that the process effectiveness can be improved.

The Third Embodiment

Figure 4:
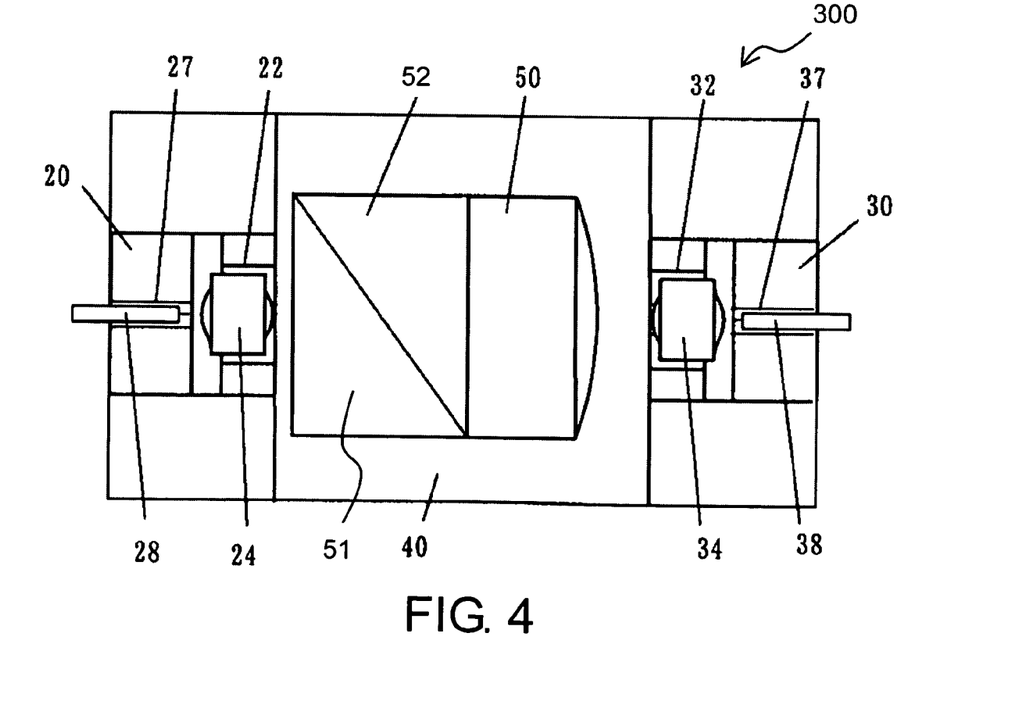
FIG. 4 is a plan view of an optical module, according to a third embodiment.

FIG. 4 is a plan view of an optical module, according to a third embodiment. The optical module 300 includes a first silicon substrate 20 having a fourth groove 27 being nearly V-letter shape at its cross sectional view (hereinafter it is called a fourth V-letter shaped groove), whose width is narrower than that of a first V-letter shaped groove 22, and a first optical bare fiber 28 disposed in the fourth V-letter shaped groove 27, instead of the Laser device 23 and the first wiring 21 used in the optical module 100 in the first embodiment. The optical module 300 further includes a second silicon substrate 30 having a fifth groove 237 being nearly V-letter shape at its cross sectional view (hereinafter it is called a fifth V-letter shaped groove), whose width is narrower than that of a second V-letter shaped groove 32, and a second optical bare fiber 38 disposed in the fifth V-letter shaped groove 37, instead of the optical modulator 33 and the second wiring 31 used in the optical module 100 in the first embodiment. The fourth and the fifth V-letter shaped grooves 27 and 37 are formed by the wet etching process so that they are formed in the accurate shapes and locations. The other components and a method of manufacturing the optical module 300 using the other components used in the optical module 300 of the third embodiment is the same as those of the first embodiment.

Thus, according to the third embodiment, the first silicon substrate 20 further includes the first V-letter shaped groove 22 and the first lens 24 disposed in the first V-letter shaped groove 22. On the first silicon substrate 20, a surface-mounted type front drive lens coupler is formed by disposing the first lens 24 in the first groove 22 and by disposing the first optical bare fiber 28 in the fourth groove 27 by using the image-recognition technique or the mechanical positioning control system in order to set a distance between a luminous surface of the first optical bare fiber 28 and the surface of the first lens 24 to an appropriate coupling length.

As well as the first silicon substrate 20, according to the third embodiment, the second silicon substrate 30 further includes the second V-letter shaped groove 22 and the second lens 34 disposed in the second V-letter shaped groove 32. In order to set a distance between a luminous surface of the second optical bare fiber 38 and the surface of the second lens 34 to an appropriate coupling length, the optical adjustment process is performed by sliding the second lens 34 along the V-letter shaped groove 32 or/and by sliding the second optical bare fiber 38 along the fifth V-letter shaped groove 37. As a result, a surface-mounted type rear drive lens coupler is formed on the second silicon substrate 30.

It is possible that an optical functional component, such as a beam splitter 52 acting as a coupler having directional property, is disposed between the first and the second lenses 24 and 34 in addition to the compact isolator 51. Thus, the optical module 300 can be applied for taking the monitoring light out and for dividing and consolidating the optical waveform. A compensation lens 50 for optically adjusting the optical dislocation of the first and the second optical fibers 28 and 38 is fixed by resin adhesive material at one end of the beam splitter 52.

The surface-mounted type from drive lens coupler is not limited to the structure described above, and it is suitable for the surface-mounted type from drive lens coupler to have a combination with an optical semiconductor device including a Laser device 23.

As described above, the same benefit applied to the first embodiment can be expected to the optical module 300 of the third embodiment.

The Fourth Embodiment

Figure 5:
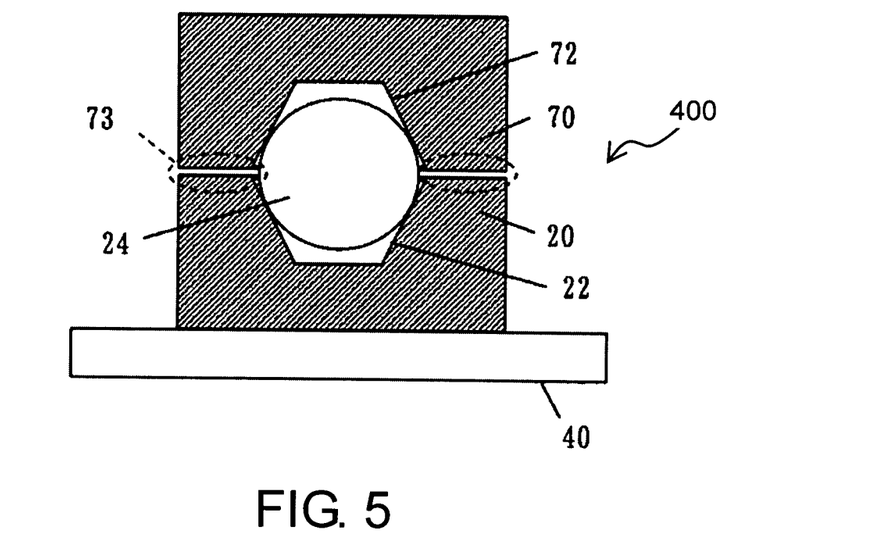
FIG. 5 is a conceptual cross-sectional view of an optical module, according to a fourth embodiment, for explaining a method of fixing a lens wherein the lens used in the fourth embodiment is the same as the lens used in the optical module of the first embodiment.

FIG. 5 is a conceptual cross-sectional view of an optical module 400, according to a fourth embodiment, for explaining a method of fixing a lens wherein the lens used in the fourth embodiment is the same as the lens used in the optical module of the first embodiment.

According to the optical module 400, a first lens is covered by a third silicon substrate 70. The third silicon substrate 70 includes a sixth groove 72 being nearly V-letter shape at its cross sectional view (hereinafter it is called a sixth V-letter shaped groove), which is to be faced to a first V-shaped groove 22. The anchorage strength of the first lens 24 is increased by covering the first lens 24 with the third silicon substrate 70 at its sixth V-letter shaped groove 72.

The first lens 24 is fixed by resin in the first V-shaped groove 22 at one of its etched slope faces or both of its etched slope faces. Since the coefficient of thermal expansion of the first lens 24 made of glass, which is almost 10 ppm/° C., is higher than that of a first silicon substrate 20, which is 3 ppm/° C., stress may be occurred between the first lens 24 and the silicon substrate 20 by the expansion/contraction of the first lens 24 in response to temperature change. As a result, the resin between the first lens 24 and the first silicon substrate 20 may be peeled off. To resolve this problem, by covering the first lens 24 with the third silicon substrate 70, the first lens 24 is held by the first silicon substrate 20 and the third silicon substrate 70 at four contacting points, which are two etched slope faces of the first silicon substrate 20 and two etched slope faces of the third silicon substrate 70.

The first silicon substrate 20 and the third silicon substrate 70 are fixed by the resin or solder at their contacting faces 73. Each of the widths of the first and sixth V-shaped grooves 22 and 72 is set to have the four contacting points with the first lens 24 all the time in the temperature range under the normal use, and to have a predetermined gap formed at the contacting faces 73 between the first silicon substrate 20 and the third silicon substrate 70. For example, since the coefficient of thermal expansion of the resin used to fix the first silicon substrate 20 and the third silicon substrate 70 is very high, such as few tens ppm/° C., the gap at the contacting faces 73 is expanded or contracted. Thus, the resin at the contacting faces 73 is acted as a buffer so that the stress, which may cause the resin between the first lens 24 and the first silicon substrate 20 to be peeled, can be absorbed by the buffer. Thus, the deterioration of the coupling characteristic caused by peeling the resin off can be avoided.

The third silicon substrate 70 can be applied to cover the second lens 34 in all embodiments, and also be applied to cover the third lens 36 used in the second embodiment.

While the invention has been described with reference to illustrative embodiments, this description is not intended to be construed in a limiting sense. Thus, shapes, size and physical relationship of each component are roughly illustrated so the scope of the invention should not be construed to be limited to them. Further, to clarify the components of the invention, hatching is partially omitted in the cross-sectional views. Moreover, the numerical description in the embodiment described above is one of the preferred examples in the preferred embodiment so that the scope of the invention should not be construed to limit to them. For example, it is possible to exchange the Laser device 23 and the optical modulator 33 to other optical semiconductor devices through all embodiments. Further, the compact isolator 51 or the compensation lens 50 can be omitted, and it is also possible to exchange the compact isolator 51 or the compensation lens 50 to other optical semiconductor devices through all embodiments. Moreover, it is possible to change the illustrative shape or the illustrative structure of the optical module through all embodiments as a whole, and another method using other material or processes can be applied.

Various other modifications of the illustrated embodiment will be apparent to those skilled in the art on reference to this description. Therefore, the appended claims are intended to cover any such modifications or embodiments as fall within the true scope of the invention.

What we claim is:

1. An optical module, comprising:
   a first silicon substrate having a first groove at its surface;
   a second silicon substrate having a second groove at its surface;
   a first optical device mounted on the first silicon substrate;
   a second optical device mounted on the second silicon substrate;
   a substrate on which the first and the second silicon substrates are mounted wherein an optical axis of the first optical device is matched up with an optical axis of the second optical device;
   a first lens transforming an divergent light emitted from the first optical device into a parallel light, disposed in the first groove; and
   a second lens converging the parallel light to the second optical device, disposed in the second groove.

2. An optical module as claimed in claim 1, wherein the first optical device includes a first wiring and a Laser device, which is connected to the first wiring, wherein the second optical device includes a second wiring and a optical modulator, which is connected to the second wiring, the optical modulator modulating the light emitted from the Laser device in response to a signal inputted via the second wiring.

3. An optical module as claimed in claim 1, wherein the first groove is nearly V-letter shaped at its cross sectional view and the second groove is nearly V-letter shaped at its cross sectional view.

4. An optical module as claimed in claim 1, further including:
   a compensation lens disposed on the substrate between the first and the second silicon substrates, adjusting a optical dislocation between the first and the second lenses; and
   an isolator, which passes light in one direction, disposed on the substrate between the first lens and the compensation lens, applying the parallel light from the first lens to the compensation lens.

5. An optical module as claimed in claim 2, wherein the second silicon substrate further includes a third groove at its surface, and further including:
   a third lens disposed in the third groove, converging a light from the optical modulator, wherein the third lens, the second lens and the optical modulator are disposed along the same optical axis.

6. An optical module as claimed in claim 5, wherein the third groove is nearly V-letter shaped at its cross sectional view.

7. An optical module as claimed in claim 1, wherein the first groove is formed on the first silicon substrate at its one end and the second groove is formed on the second silicon substrate at its one end, wherein the first silicon substrate further includes a fourth groove at its other end, and the second silicon substrate further includes a fifth groove at its other end, and wherein the first optical device, which is disposed in the fourth groove, is formed by a first bare optical fiber and the second optical device, which is disposed in the fifth groove, is formed by a second bare optical fiber.

8. An optical module as claimed in claim 7, further including:
   a compensation lens disposed on the substrate between the first and the second silicon substrates, adjusting a optical dislocation between the first and the second lenses;
   an isolator, which passes light in one direction, disposed on the substrate between the first lens and the compensation lens, applying the parallel light from the first lens to the compensation lens; and
   a beam splitter disposed between the compensation lens and the first silicon substrate, transforming the parallel light emitted from the first lens and applying the transformed light to the compensation lens.

9. An optical module as claimed in claim 2, further including:
   a third silicon substrate having a sixth groove, wherein the first lens or the second lens is covered from its above by the sixth groove formed in the third silicon substrate.

10. An optical module as claimed in claim 2, wherein the optical modulator is formed by a Mach-Zehnder type optical modulator.

11. A method of manufacturing a optical module, comprising:
    mounting a Laser device on a first silicon device having a first wiring and a first groove;
    electrically connecting the Laser device to the first wiring;
    performing a first burn-in test to the Laser device and the first wiring;
    mounting an optical modulator on a second silicon device having a second wiring and a second groove;
    electrically connecting the optical modulator to the second wiring;
    performing a second burn-in test to the optical modulator and the second wiring;
    mounting the first and the second silicon substrates on a substrates after performing the first and the second burn-in tests;
    placing a first lens in the first groove; and
    placing a second groove in the second groove.

12. A method of manufacturing a optical module as claimed in claim 11, wherein during mounting the first and the second silicon substrates on the substrate, the first and the second silicon substrates are positioned so that an optical axis of the Laser device is matched up with an optical axis of the optical modulator by using the first and the second grooves.

13. A method of manufacturing a optical module as claimed in claim 12, wherein positioning the first and the second silicon substrates is performed mechanically by using a guide member, which is placed in the first and the second grooves, and is pressed form the above.

14. A method of manufacturing a optical module as claimed in claim 11, wherein mounting the Laser device or the optical modulator is performed by an image recognition technology.

15. A method of manufacturing a optical module as claimed in claim 14, further comprising;
disposing a compensation lens on the substrate between the first and the second silicon substrates, the compensation lens adjusting a optical dislocation between the first and the second lenses.

16. A method of manufacturing a optical module as claimed in claim 15, further comprising;
disposing an isolator, which passes light in one direction, disposed on the substrate between the first lens and the compensation lens, the isolator applying a parallel light from the first lens to the compensation lens.

* * * * *